United States Patent
Huang et al.

(10) Patent No.: US 11,025,156 B2
(45) Date of Patent: Jun. 1, 2021

(54) POWER APPARATUS, CURRENT DETECTING CIRCUIT AND CURRENT DETECTING METHOD

(71) Applicant: FSP TECHNOLOGY INC., Taoyuan (TW)

(72) Inventors: Yaw-Chien Huang, Taoyuan (TW); Chun-Hao Yu, Taoyuan (TW); Kuo-Chieh Chan, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 100 days.

(21) Appl. No.: 16/504,312

(22) Filed: Jul. 7, 2019

(65) Prior Publication Data

US 2020/0099219 A1    Mar. 26, 2020

(30) Foreign Application Priority Data

Sep. 26, 2018  (TW) .................................. 107133913

(51) Int. Cl.
*H02M 1/32* (2007.01)
*H02H 9/02* (2006.01)
(Continued)

(52) U.S. Cl.
CPC .............. *H02M 1/32* (2013.01); *G01R 15/04* (2013.01); *H02H 9/02* (2013.01); *H02M 2001/0009* (2013.01)

(58) Field of Classification Search
CPC ...... H02H 9/02; H02H 1/0007; G01R 19/165; G01R 19/16538; G01R 19/0092
See application file for complete search history.

(56) References Cited

U.S. PATENT DOCUMENTS

2012/0154957 A1* 6/2012 Williams ................ H02H 1/06
361/1
2020/0059083 A1* 2/2020 Li ...................... H03K 17/0822

FOREIGN PATENT DOCUMENTS

TW        201417434       5/2014
TW        201742358       12/2017

OTHER PUBLICATIONS

"Office Action of Taiwan Counterpart Application", dated Jul. 3, 2019, pp. 1-11.

* cited by examiner

*Primary Examiner* — Fred E Finch, III
*Assistant Examiner* — Rafael O De Leon Domenech
(74) *Attorney, Agent, or Firm* — JCIPRNET

(57) ABSTRACT

A power apparatus, a current detecting circuit and a current detecting method are provided. The power apparatus includes a power conversion circuit and the current detecting circuit. The power conversion circuit generates an output current. The current detecting circuit includes first and second current sensing resistors and a control circuit. The first current sensing resistor and the second current sensing resistor sense the output current to generate first and second sensing voltage, respectively. The control circuit receives the first sensing voltage and the second sensing voltage, and converts the first sensing voltage and the second sensing voltage respectively into a first current sensing value and a second current sensing value. The control circuit triggers a protection mechanism when the first current sensing value is greater than a first overcurrent protection value. In the case where the first current sensing value is not greater than the first overcurrent protection value, the control circuit triggers the protection mechanism if the second current sensing value is greater than a second overcurrent protection value.

(Continued)

The first overcurrent protection value is greater than the second overcurrent protection value.

7 Claims, 5 Drawing Sheets

(51) Int. Cl.
    *G01R 15/04*         (2006.01)
    *H02M 1/00*         (2006.01)

POWER APPARATUS, CURRENT DETECTING CIRCUIT AND CURRENT DETECTING METHOD

CROSS-REFERENCE TO RELATED APPLICATION

This application claims the priority benefit of Taiwan Application No. 107133913, filed on Sep. 26, 2018. The entirety of the above-mentioned patent application is hereby incorporated by reference herein and made a part of this specification.

BACKGROUND OF THE INVENTION

1. Field of the Invention

The invention relates to a power apparatus, and more particularly, to a power apparatus and a current sensing circuit thereof in compliance with limited power source (LPS) and a current detecting method.

2. Description of Related Art

With the advancement of technology, electronic information products have become an indispensable tool in people's daily lives. Various power apparatus have emerged to provide the power required for the operation of electronic information products. Further, in order to ensure the safety of the power apparatus, the power apparatus needs to pass various safety tests.

Specifically, as specified in the safety standard IEC 60950-1, the electronic information products are required to have a suitable fireproof enclosure. Yet, it is also specified that, when the power of the electronic information products is provided by the limited power source (LPS), if electronic components therein are mounted on a printed circuit board with the fire-proof level of V-1 or higher, the electronic information products do not need to have the fireproof enclosure. Therefore, suppliers of the electronic information products usually demand that the power apparatus can be comply with the requirements of the limited power source.

However, for allowing the power apparatus to pass test items of the power limited source, it is usually necessary to additionally dispose a detecting circuit in the power apparatus. To prevent the detecting circuit from affecting a conversion efficiency of the power apparatus, the detecting circuit is usually disposed with a detecting resistor with a very small resistance. In addition, in order to obtain accurate detecting values, the detecting resistor needs to be additionally disposed with an amplifying circuit, which will increase the manufacturing cost of the power apparatus. Therefore, how to allow the power apparatus to pass the test items of the power limited source while avoiding adding too much manufacturing cost is one of the major issues faced by those skilled in the art.

SUMMARY OF THE INVENTION

Accordingly, the invention provides a power apparatus, a current detecting circuit and a current detecting method to not only allow the power apparatus to pass the test items of the limited power source, but also to prevent a significant increase in the manufacturing cost of the power apparatus.

The current detecting circuit of the invention includes a first current sensing resistor, a second current sensing resistor and a control circuit. The first current sensing resistor is configured to sense an output current of a power apparatus to generate a first sensing voltage. The second current sensing resistor is configured to sense the output current to generate a second sensing voltage. The control circuit is coupled to two ends of the first current sensing resistor and two ends of the second current sensing resistor to receive the first sensing voltage and the second sensing voltage, and converts the first sensing voltage and the second sensing voltage respectively into a first current sensing value and a second current sensing value. The control circuit triggers a protection mechanism when the first current sensing value is greater than a first overcurrent protection value. In the case where the first current sensing value is not greater than the first overcurrent protection value, the control circuit triggers the protection mechanism if the second current sensing value is greater than a second overcurrent protection value. Here, the first overcurrent protection value is greater than the second overcurrent protection value.

In an embodiment of the invention, when the first current sensing value is not greater than the first overcurrent protection value, if the first current sensing value is equal to a reference current value and the second current sensing value is greater than the second overcurrent protection value, the control circuit determines that the first current sensing resistor is shorted, and the control circuit triggers the protection mechanism to limit the output current. Here, the reference current value is less than the second overcurrent protection value.

In an embodiment of the invention, the reference current value is a zero current value.

In an embodiment of the invention, the control circuit includes an amplifying circuit, a first analog-to-digital conversion circuit, a second analog-to-digital conversion circuit and a control body. The amplifying circuit is coupled to the two ends of the first current sensing resistor to amplify the first sensing voltage and accordingly generate an amplified voltage. The first analog-to-digital conversion circuit is coupled to the amplifying circuit to receive the amplified voltage and perform an analog-to-digital conversion on the amplified voltage to generate the first current sensing value. The second analog-to-digital conversion circuit is directly coupled to the two ends of the second current sensing resistor, and configured to perform the analog-to-digital conversion on the second sensing voltage and accordingly generate the second current sensing value. The control body is coupled to the first analog-to-digital conversion circuit and the second analog-to-digital conversion circuit to receive the first current sensing value and the second current sensing value. When the first current sensing value is not greater than the first overcurrent protection value, if the first current sensing value is equal to a reference current value and the second current sensing value is greater than the second overcurrent protection value, the control body determines that the first current sensing resistor is shorted, and the control body triggers the protection mechanism to limit the output current. Here, the reference current value is less than the second overcurrent protection value.

The power apparatus of the invention includes a power conversion circuit and the current detecting circuit. The power conversion circuit is configured to generate an output current. The current detecting circuit is coupled to the power conversion circuit to detect the output current. The current detecting circuit includes a first current sensing resistor, a second current sensing resistor and a control circuit. The first current sensing resistor is configured to sense the output current to generate a first sensing voltage. The second current sensing resistor is configured to sense the output current to generate a second sensing voltage. The control circuit is coupled to two ends of the first current sensing resistor and two ends of the second current sensing resistor to receive the first sensing voltage and the second sensing voltage, and converts the first sensing voltage and the second sensing voltage respectively into a first current sensing value and a second current sensing value. The control circuit triggers a protection mechanism when the first current sensing value is greater than a first overcurrent protection value. In the case where the first current sensing value is not greater than the first overcurrent protection value, the control circuit triggers the protection mechanism if the second current sensing value is greater than a second overcurrent protection value. Here, the first overcurrent protection value is greater than the second overcurrent protection value.

The current detecting method of the invention includes following steps. An output current of a power apparatus is sensed by a first current sensing resistor to obtain a first sensing voltage. The output current is sensed by a second current sensing resistor to obtain a second sensing voltage. The first sensing voltage and the second sensing voltage are respectively converted into a first current sensing value and a second current sensing value by a control circuit. A protection mechanism is triggered by the control circuit if the first current sensing value is greater than a first overcurrent protection value. In the case where the first current sensing value is not greater than the first overcurrent protection value, the protection mechanism is triggered by the control circuit if the second current sensing value is greater than a second overcurrent protection value. Here, the first overcurrent protection value is greater than the second overcurrent protection value.

Based on the above, the power apparatus, the current detecting circuit and the current detecting method provided by the embodiments of the invention can allow the control circuit to correctly trigger the protection mechanism by a determination condition "the first current sensing value is not greater than the first overcurrent protection value and the second current sensing value is greater than the second overcurrent protection value". In this way, not only can the power apparatus successfully pass the test items of the limited power source, the manufacturing cost of the power apparatus may also be reduced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

In order to make content of the invention more comprehensible, embodiments are described below as the examples to prove that the invention can actually be realized. In addition, whenever possible, identical or similar reference numbers stand for identical or similar elements in the figures and the embodiments.

Figure 1:
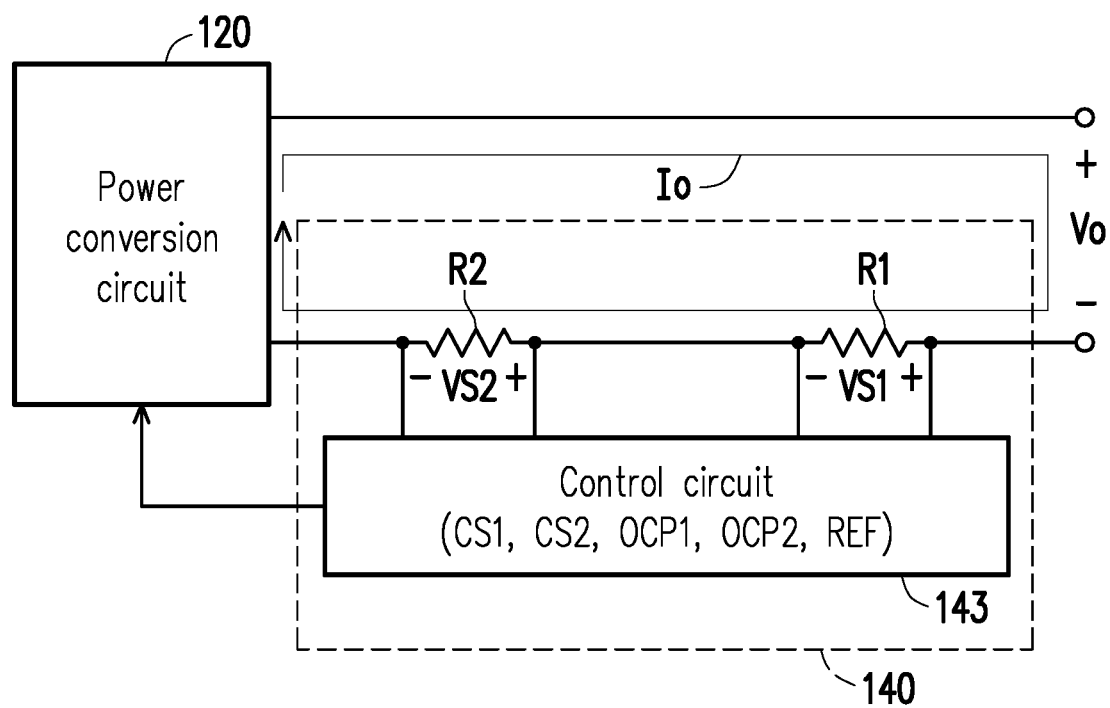
FIG. 1 is a circuit block diagram illustrating a power apparatus according to an embodiment of the invention.

FIG. 1 is a circuit block diagram illustrating a power apparatus according to an embodiment of the invention. With reference to FIG. 1, a power apparatus 100 includes a power conversion circuit 120 and a current detecting circuit 140. The power conversion circuit 120 is configured to generate an output voltage Vo and an output current Io for providing the power required by a load to operate. The current detecting circuit 140 is coupled to the power conversion circuit 120 to detect the output current Io.

To be specific, the current detecting circuit 140 includes a first current sensing resistor R1, a second current sensing resistor R2 and a control circuit 143. The first current sensing resistor R1 is configured to sense the output current Io to generate a first sensing voltage VS1. The second current sensing resistor R2 is configured to sense the output current Io to generate a second sensing voltage VS2. The control circuit 143 is coupled to two ends of the first current sensing resistor R1 and two ends of the second current sensing resistor R2 to receive the first sensing voltage VS1 and the second sensing voltage VS2. The control circuit 143 converts the first sensing voltage VS1 and the second sensing voltage VS2 respectively into a first current sensing value CS1 and a second current sensing value CS2. The control circuit 143 can determine whether to trigger a protection mechanism according to the first current sensing value CS1 and the second current sensing value CS2.

More specifically, in the case where the first current sensing resistor R1 and the second current sensing resistor R2 are both normal, when the output current Io is less than an overcurrent value, the first current sensing value CS1 will be less than a first overcurrent protection value OCP1 and the second current sensing value CS2 will also be less than a second overcurrent protection value OCP2. Accordingly, the control circuit 143 can determine that the power apparatus 100 is operating normally without triggering the protection mechanism. Conversely, when the output current Io is greater than the overcurrent value, the first current sensing value C1 will be greater than the first overcurrent protection value OCP1, and thus the control circuit 143 can determine that the power apparatus 100 is operating abnormally and trigger the protection mechanism.

In addition, when the power apparatus 100 is subject to the limited power source (LPS) test, the first current sensing resistor R1 will be shorted to simulate whether the power apparatus 100 can pass the limited power source test in the event of a single component failure. Since the first current sensing resistor R1 is shorted, even if the output current Io is greater than the overcurrent value, the first sensing voltage VS1 received by the control circuit 143 is still extremely small so the first current sensing value CS1 would not be greater than the first over-current protection value OCP1. In this case, the control circuit 143 can then determine whether to trigger the protection mechanism according to the second current sensing value CS2 so the power apparatus 100 can pass the limited power source test. In detail, in the case where the first current sensing value CS1 is not greater than the first overcurrent protection value OCP1, if the second current sensing value CS2 is greater than the second overcurrent protection value OCP2, the control circuit 143 can determine that the output current Io is greater than the overcurrent value and accordingly trigger the protection mechanism. Here, the first overcurrent protection value OCP1 is greater than the second overcurrent protection value OCP2.

It should be understood that, the second current sensing resistor R2 may be used to assist the control circuit 143 to determine whether the first current sensing resistor R1 is shorted. In addition, in the case where the first current sensing resistor R1 is shorted, the control circuit 143 can determine whether to trigger the protection mechanism according to the second current sensing value CS2 so the power apparatus 100 can pass the limited power source test.

In an embodiment of the invention, when the first current sensing value CS1 is not greater than the first overcurrent protection value OCP1, if the first current sensing value CS1 is equal to a reference current value REF and the second current sensing value CS2 is greater than the second overcurrent protection value OCP2, the control circuit 143 determines that the first current sensing resistor R1 is shorted, and the control circuit 143 triggers the protection mechanism to limit the output current Io of the power conversion circuit 120. Here, the reference current value REF is less than the second overcurrent protection value OCP2.

In an embodiment of the invention, the reference current value REF is a zero current value. However, the invention is not limited to the above, and the reference current value may be determined depending on actual applications and design requirements.

In an embodiment of the invention, when the control circuit 143 triggers the protection mechanism, the control circuit 143 can generate a control signal for the power conversion circuit 120. The power conversion circuit 120 can perform an overcurrent protection operation in response to the control signal to reduce a current value of the output current Io. The overcurrent protection operation is well-known to persons of ordinary skill in the art and thus not repeated hereinafter.

In an embodiment of the invention, the power apparatus 100 may be, for example, a PD (Power Delivery) apparatus with adjustable output voltage and output current, but not limited thereto. In an embodiment of the invention, the power apparatus 100 may be, for example, a PD apparatus in compliance with USB 3.1 power delivery specification.

In an embodiment of the invention, the power conversion circuit 120 may be, for example, an AC-to-DC converter or a DC-to-DC converter with overcurrent protection functions. Nevertheless, the disclosure is not limited in this regard. The type of the power conversion circuit 120 is not particularly limited by the invention.

Figure 2:
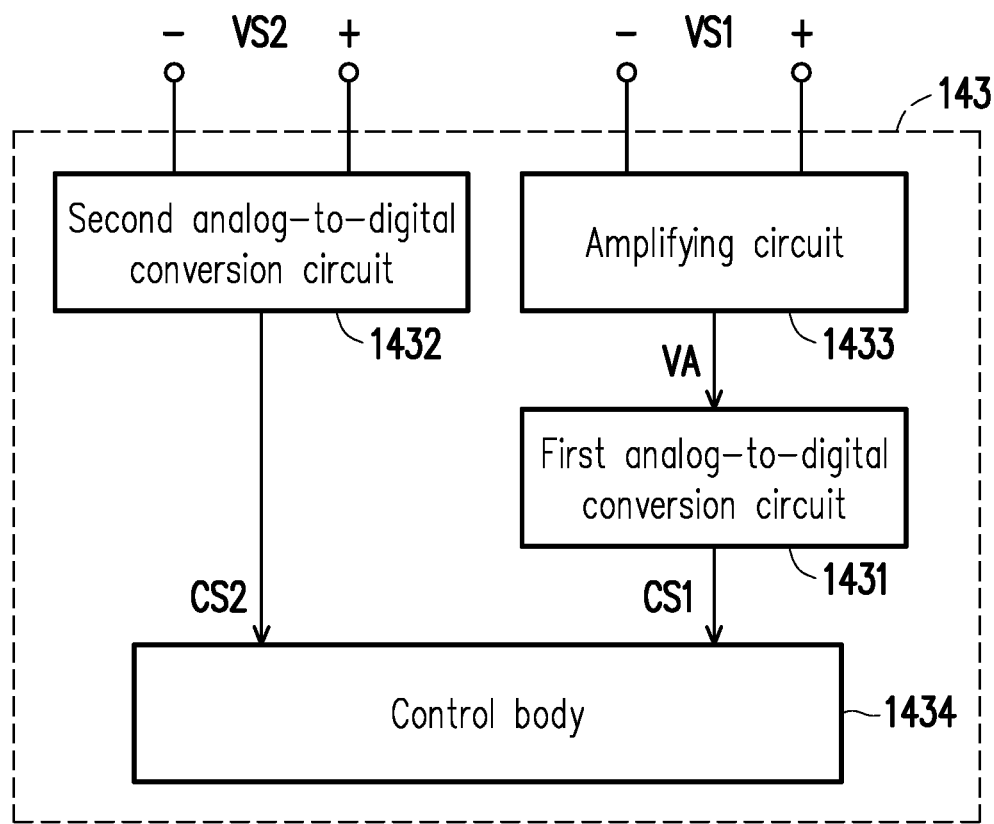
FIG. 2 is a circuit block diagram illustrating a control circuit according to an embodiment of the invention.

FIG. 2 is a circuit block diagram illustrating a control circuit according to an embodiment of the invention. Referring to FIG. 1 and FIG. 2 together, the control circuit 143 may include an amplifying circuit 1433, a first analog-to-digital conversion circuit 1431, a second analog-to-digital conversion circuit 1432 and a control body 1434. The amplifying circuit 1433 is coupled to the two ends of the first current sensing resistor R1 to amplify the first sensing voltage VS1 and accordingly generate an amplified voltage VA. The first analog-to-digital conversion circuit 1431 is coupled to the amplifying circuit 1433 to receive the amplified voltage VA and perform an analog-to-digital conversion on the amplified voltage VA to generate the first current sensing value CS1. The second analog-to-digital conversion circuit 1432 is directly coupled to the two ends of the second current sensing resistor R2, and configured to perform the analog-to-digital conversion on the second sensing voltage VS2 and accordingly generate the second current sensing value CS2.

The control body 1434 is configured to serve as an operation core of the control circuit 143. Specifically, the control body 1434 is coupled to the first analog-to-digital conversion circuit 1431 and the second analog-to-digital conversion circuit 1432 to receive the first current sensing value CS1 and the second current sensing value CS2. The control body 1434 can compare the first current sensing value CS1 with the reference current value REF and compare the second current sensing value CS2 with the second overcurrent protection value OCP2. In the case where the first current sensing value CS1 is not greater than the first overcurrent protection value OCP1, if the first current sensing value CS1 is equal to the reference current value REF and the second current sensing value CS2 is greater than the second overcurrent protection value OCP2, the control body 1434 determines that the first current sensing resistor R1 is shorted, and the control body 1434 triggers the protection mechanism to limit the output current Io of the power conversion circuit 120. Further, other operation details regarding the control body 1434 may refer to the related description for the control circuit 143, which is not repeated hereinafter.

It is worth noting that, in order to reduce a hardware cost of the control circuit 143, there is no amplifying circuit additionally disposed between the second analog-to-digital conversion circuit 1432 and the second current sensing resistor R2. In other words, the second analog-to-digital conversion circuit 1432 is directly coupled to the two ends of the second current sensing resistor R2, and directly converts the second sensing voltage VS2 into the second current sensing value CS2. Although such a design may make the accuracy of the second current sensing value CS2 lower than the accuracy of the first current sensing value CS1, with the aid of the determination condition "the first current sensing value CS1 is equal to the reference current value REF and the second current sensing value CS2 is greater than the second overcurrent protection value OCP2", the control circuit 143 can still correctly determine that the output current Io is greater than or equal to the overcurrent value when the first current sensing resistor R1 is shorted, and trigger the protection mechanism so the power apparatus 100 can pass the test items of the limited power source.

In an embodiment of the invention, the amplifying circuit 1433 may be implemented by using an operational amplifier (OPA), but the invention is not limited thereto. In another embodiment of the invention, the amplifying circuit 1433 may be implemented by adopting the existing voltage amplifying circuit.

In an embodiment of the invention, the first analog-to-digital conversion circuit 1431 and the second analog-to-digital conversion circuit 1432 may be implemented by using the existing analog-to-digital converter.

In an embodiment of the invention, the control body 1434 may be hardware, firmware, software or machine executable program codes stored in a memory to be loaded and executed by a micro-processor (or a micro-controller). In form of hardware, the control body 1434 may be implemented by using one single integrated circuit chip, or may be implemented by using a plurality of circuit chips. However, the invention is not limited in this regard. The circuit chips or the integrated circuit chip may be implemented by adopting an application-specific integrated circuit (ASIC) or a field programmable gate array (FPGA) or a complex programmable logic device (CPLD). The memory may be, for example, a random access memory, a read-only memory or a flash memory.

Figure 3:
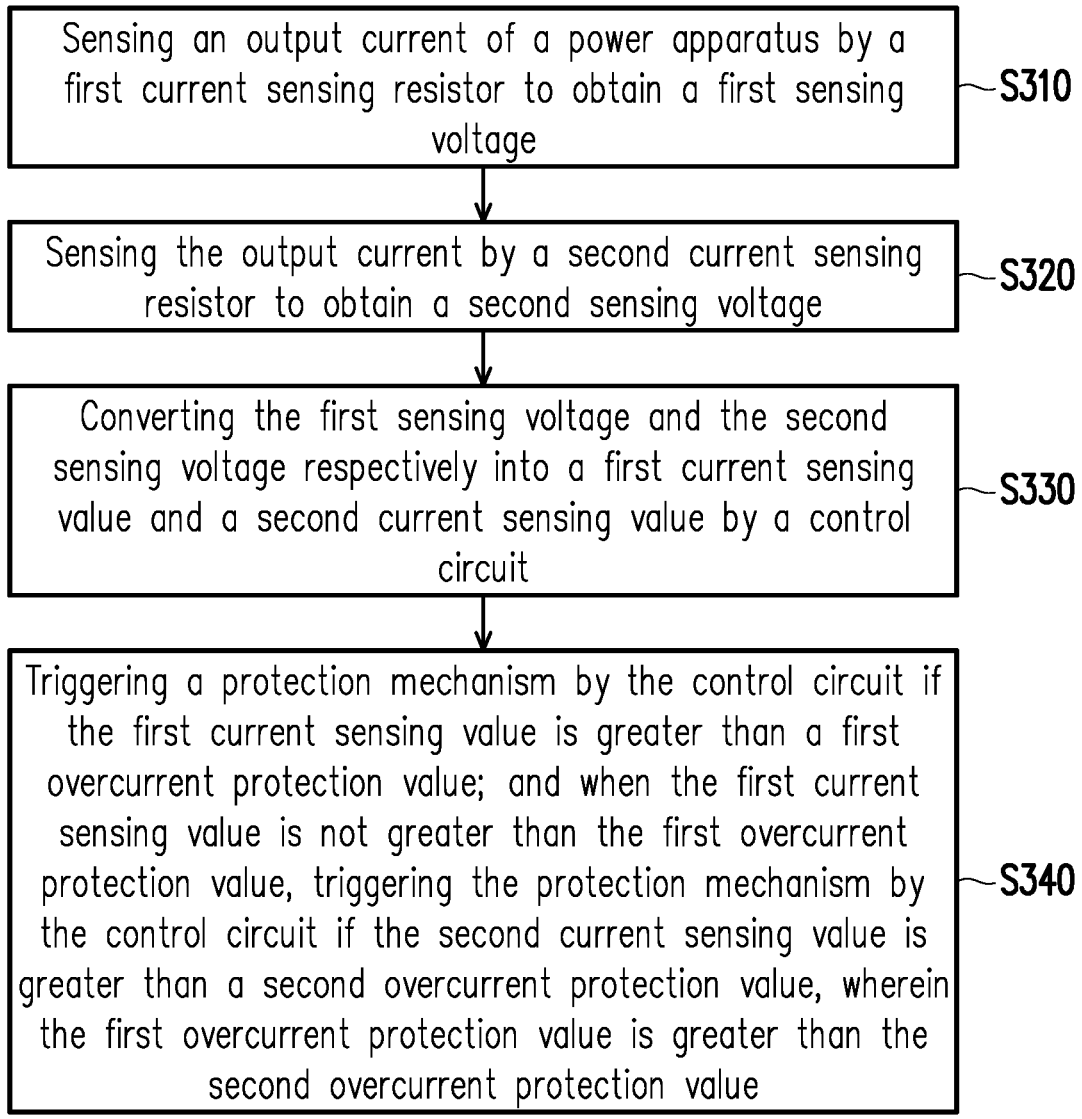
FIG. 3 is a flowchart illustrating steps in the current detecting method according to an embodiment of the invention.

FIG. 3 is a flowchart illustrating steps in the current detecting method according to an embodiment of the invention, which is applicable to the power apparatus 100 of FIG. 1 but not limited thereto. Referring to FIG. 1 and FIG. 3 together, the current detecting method includes steps S310, S320, S330 and S340. In step S310, the output current Io of the power apparatus 100 is sensed by the first current sensing resistor R1 to obtain the first sensing voltage VS1. In step S320, the output current Io is sensed by the second current sensing resistor R2 to obtain the second sensing voltage VS2. It should be understood that, step S320 may be executed prior to step S310, or step S310 and step S320 may be executed simultaneously.

Next, in step S330, the first sensing voltage VS1 and the second sensing voltage VS2 are respectively converted into the first current sensing value CS1 and the second current sensing value CS2 by the control circuit 143. Then, in step S340, the protection mechanism is triggered by the control circuit 143 if the first current sensing value CS1 is greater than the first overcurrent protection value OCP1; and when the first current sensing value CS1 is not greater than the first overcurrent protection value OCP1, the protection mechanism is triggered by the control circuit 143 if the second current sensing value CS2 is greater than the second overcurrent protection value OCP2, wherein the first overcurrent protection value OCP1 is greater than the second overcurrent protection value OCP2.

Figure 4:
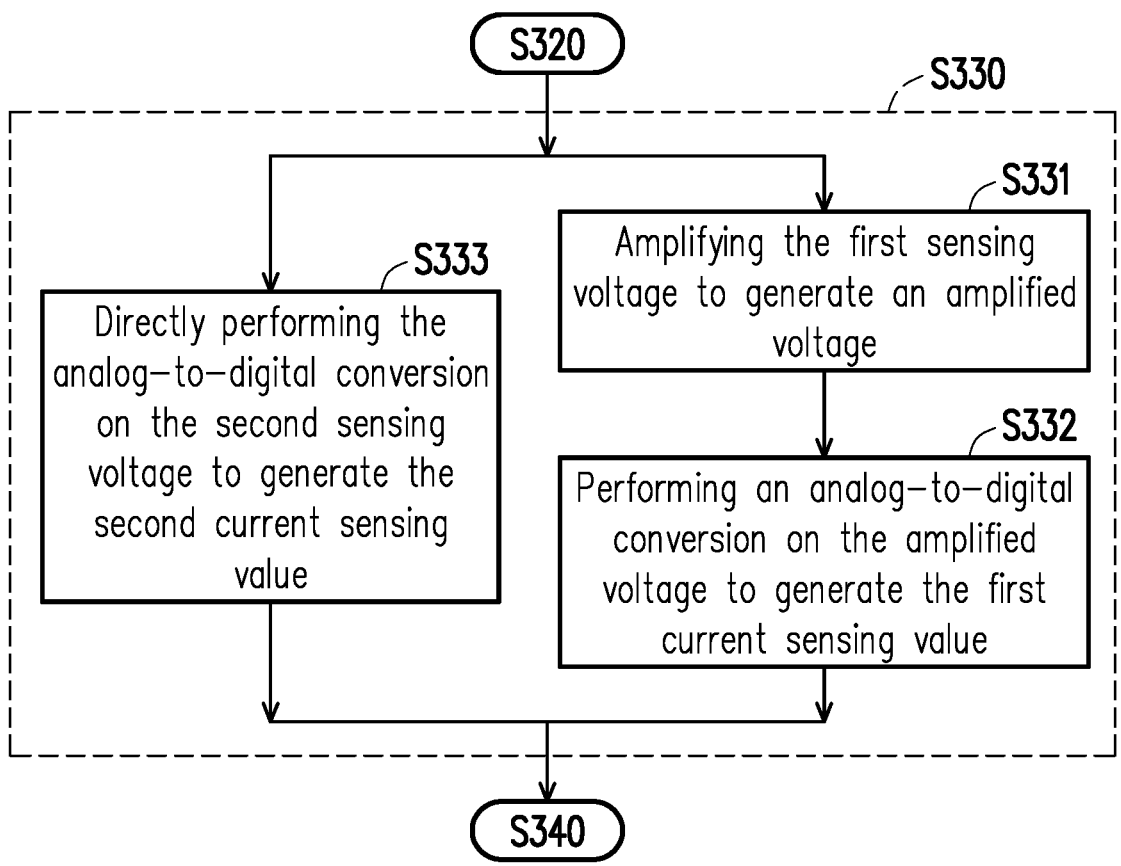
FIG. 4 is a flowchart illustrating detailed steps in step S330 of FIG. 3 according to an embodiment of the invention.

FIG. 4 is a flowchart illustrating detailed steps in step S330 of FIG. 3 according to an embodiment of the invention. It should be noted that, steps in FIG. 4 are merely examples and are not intended to limit the order for executing the detailed steps. Referring to FIG. 1 and FIG. 4 together, step S330 includes detailed steps S331 to S333. In step S331, the first sensing voltage VS1 is amplified to generate the amplified voltage VA. Then, in step S332, the analog-to-digital conversion is performed on the amplified voltage VA to generate the first current sensing value CS1. On the other hand, in step S333, the analog-to-digital conversion is directly performed on the second sensing voltage VS2 to generate the second current sensing value CS2.

Figure 5:
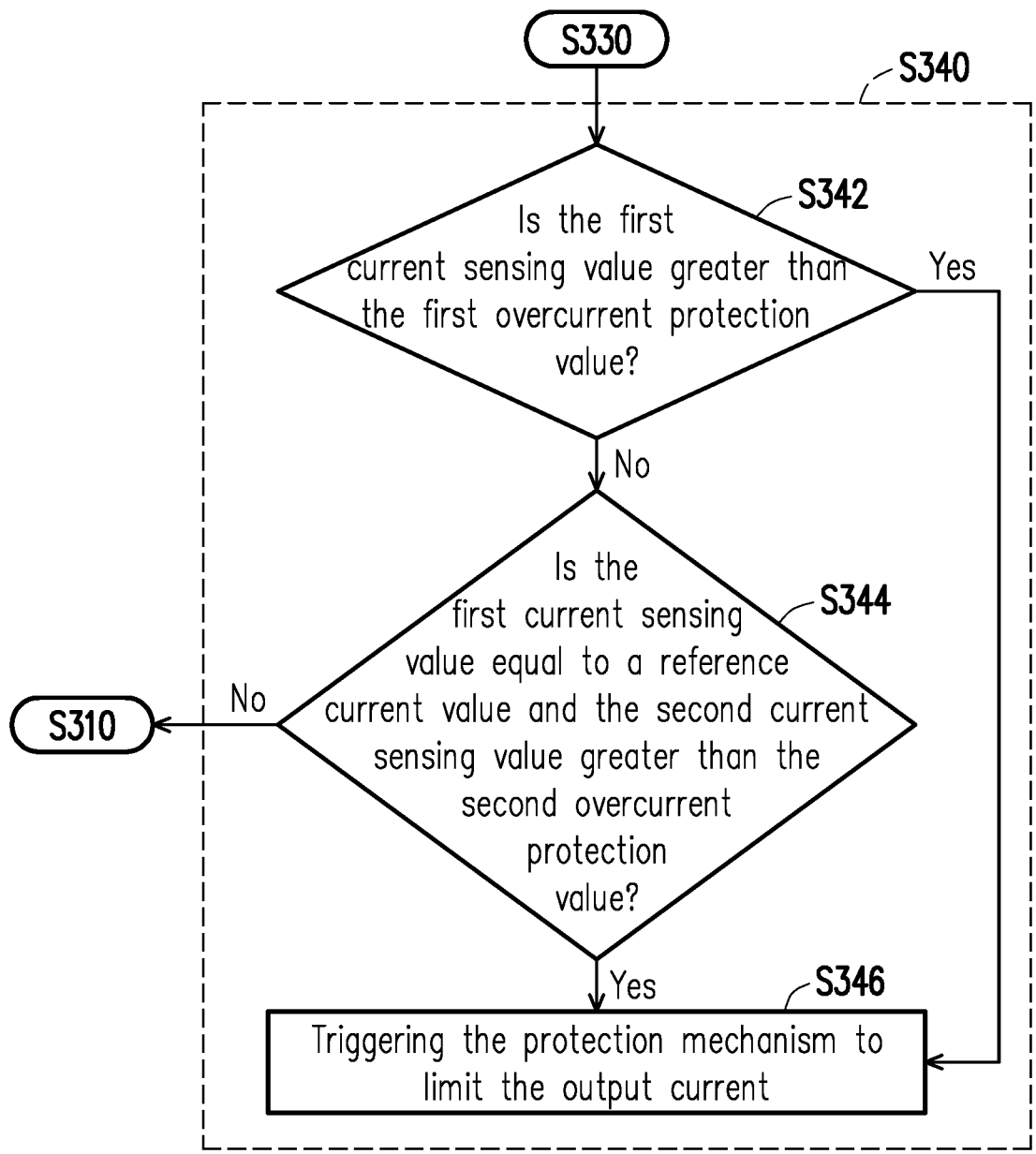
FIG. 5 is a flowchart illustrating detailed steps in step S340 of FIG. 3 according to an embodiment of the invention.

FIG. 5 is a flowchart illustrating detailed steps in step S340 of FIG. 3 according to an embodiment of the invention. Referring to FIG. 1 and FIG. 5 together, step S340 includes detailed steps S342, S344 and S346. First, in step S342, whether the first current sensing value CS1 is greater than the overcurrent protection value OCP1 is determined to obtain a first determination result. If the first determination result is "Yes", which means that the output current Io is greater than the overcurrent value, the protection mechanism is triggered by the control circuit 143 to limit the output current Io, as shown by step S346. Otherwise, if the first determination result is "No", whether the first current sensing value CS1 is equal to the reference current value REF and whether the second current sensing value CS2 is greater than the second overcurrent protection value OCP2 are determined to obtain a second determination result, as shown by step S344. If the second determination result is "Yes", which means that the output current Io is greater than the overcurrent value, the protection mechanism is triggered by the control circuit 143 to limit the output current Io, as shown by step S346. Otherwise, if the second determination result is "No", which means that the output current Io is less than the overcurrent value, the process returns to step S310 of FIG. 3 in which a next current detecting operation is performed.

In addition, enough teaching, suggestion, and implementation of the current detecting method in this embodiment of the invention may be obtained from the embodiments of FIG. 1 and FIG. 2, and thus details regarding the same are not repeated hereinafter.

In summary, the power apparatus, the current detecting circuit and the current detecting method provided by the embodiments of the invention can allow the control circuit to correctly trigger the protection mechanism by the determination condition "the first current sensing value is not greater than the first overcurrent protection value and the second current sensing value is greater than the second overcurrent protection value" in the case where the accuracy of the second current sensing value is lower than the accuracy of the first current sensing value. In this way, not only can the power apparatus could successfully pass the test items of the limited power source, increases of the manufacturing cost of the power apparatus for improving the accuracy of the second current sensing value could also be avoided.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A current detecting circuit, comprising:
   a first current sensing resistor, configured to sense an output current of a power apparatus to obtain a first sensing voltage;
   a second current sensing resistor, configured to sense the output current to obtain a second sensing voltage; and
   a control circuit, coupled to two ends of the first current sensing resistor and two ends of the second current sensing resistor to receive the first sensing voltage and the second sensing voltage, and converting the first sensing voltage and the second sensing voltage respectively into a first current sensing value and a second current sensing value, wherein the control circuit triggers a protection mechanism when the first current sensing value is greater than a first overcurrent protection value,
   wherein when the first current sensing value is not greater than the first overcurrent protection value, the control circuit triggers the protection mechanism if the second current sensing value is greater than a second overcurrent protection value, wherein the first overcurrent protection value is greater than the second overcurrent protection value,
   wherein the control circuit comprises:
      an amplifying circuit, coupled to the two ends of the first current sensing resistor to amplify the first sensing voltage and accordingly generate an amplified voltage;
      a first analog-to-digital conversion circuit, coupled to the amplifying circuit to receive the amplified voltage and perform an analog-to-digital conversion on the amplified voltage to generate the first current sensing value;
      a second analog-to-digital conversion circuit, directly coupled to the two ends of the second current sensing resistor, and configured to perform the analog-todigital conversion on the second sensing voltage and accordingly generate the second current sensing value; and a control body, coupled to the first analog-to-digital conversion circuit and the second analog-to-digital conversion circuit to receive the first current sensing value and the second current sensing value, wherein when the first current sensing value is not greater than the first overcurrent protection value, if the first current sensing value is equal to a reference current value and the second current sensing value is greater than the second overcurrent protection value, the control body determines that the first current sensing resistor is shorted, and the control body triggers the protection mechanism to limit the output current, wherein the reference current value is less than the second overcurrent protection value.

2. The current detecting circuit according to claim 1, wherein the reference current value is a zero current value.

3. A power apparatus, comprising:
a power conversion circuit, configured to generate an output current; and
a current detecting circuit, coupled to the power conversion circuit to detect the output current, the current detecting circuit comprising:
a first current sensing resistor, configured to sense the output current to obtain a first sensing voltage;
a second current sensing resistor, configured to sense the output current to obtain a second sensing voltage; and
a control circuit, coupled to two ends of the first current sensing resistor and two ends of the second current sensing resistor to receive the first sensing voltage and the second sensing voltage, and converting the first sensing voltage and the second sensing voltage respectively into a first current sensing value and a second current sensing value, wherein the control circuit triggers a protection mechanism when the first current sensing value is greater than a first overcurrent protection value,
wherein when the first current sensing value is not greater than the first overcurrent protection value, the control circuit triggers the protection mechanism if the second current sensing value is greater than a second overcurrent protection value, wherein the first overcurrent protection value is greater than the second overcurrent protection value,
wherein the control circuit comprises:
an amplifying circuit, coupled to the two ends of the first current sensing resistor to amplify the first sensing voltage and accordingly generate an amplified voltage;
a first analog-to-digital conversion circuit, coupled to the amplifying circuit to receive the amplified voltage and perform an analog-to-digital conversion on the amplified voltage to generate the first current sensing value;
a second analog-to-digital conversion circuit, directly coupled to the two ends of the second current sensing resistor, and configured to perform the analog-to-digital conversion on the second sensing voltage and accordingly generate the second current sensing value; and
a control body, coupled to the first analog-to-digital conversion circuit and the second analog-to-digital conversion circuit to receive the first current sensing value and the second current sensing value, wherein when the first current sensing value is not greater than the first overcurrent protection value, if the first current sensing value is equal to a reference current value and the second current sensing value is greater than the second overcurrent protection value, the control body determines that the first current sensing resistor is shorted, and the control body triggers the protection mechanism to limit the output current, wherein the reference current value is less than the second overcurrent protection value.

4. The power apparatus according to claim 3, wherein the reference current value is a zero current value.

5. A current detecting method, comprising:
sensing an output current of a power apparatus by a first current sensing resistor to obtain a first sensing voltage;
sensing the output current by a second current sensing resistor to obtain a second sensing voltage;
converting the first sensing voltage and the second sensing voltage respectively into a first current sensing value and a second current sensing value by a control circuit;
triggering a protection mechanism by the control circuit if the first current sensing value is greater than a first overcurrent protection value; and
when the first current sensing value is not greater than the first overcurrent protection value, triggering the protection mechanism by the control circuit if the second current sensing value is greater than a second overcurrent protection value, wherein the first overcurrent protection value is greater than the second overcurrent protection value,
wherein the step of converting the first sensing voltage and the second sensing voltage respectively into the first current sensing value and the second current sensing value by the control circuit comprises:
amplifying the first sensing voltage to generate an amplified voltage;
performing an analog-to-digital conversion on the amplified voltage to generate the first current sensing value; and
directly performing the analog-to-digital conversion on the second sensing voltage to generate the second current sensing value,
wherein when the first current sensing value is not greater than the first overcurrent protection value, the step of triggering the protection mechanism by the control circuit if the second current sensing value is greater than the second overcurrent protection value comprises:
triggering the protection mechanism by the control circuit to limit the output current if the first current sensing value is equal to a reference current value and the second current sensing value is greater than the second overcurrent protection value, wherein the reference current value is less than the second overcurrent protection value.

6. The current detecting method according to claim 5, wherein when the first current sensing value is not greater than the first overcurrent protection value, the step of triggering the protection mechanism by the control circuit if the second current sensing value is greater than the second overcurrent protection value comprises:
triggering the protection mechanism by the control circuit to limit the output current if the first current sensing value is equal to a reference current value and the second current sensing value is greater than the second overcurrent protection value, wherein the reference current value is less than the second overcurrent protection value.

7. The current detecting method according to claim 6, wherein the reference current value is a zero current value.

\* \* \* \* \*